United States Patent
Arvin et al.

(10) Patent No.: US 11,521,952 B2
(45) Date of Patent: *Dec. 6, 2022

(54) SPACER FOR DIE-TO-DIE COMMUNICATION IN AN INTEGRATED CIRCUIT AND METHOD FOR FABRICATING THE SAME

(71) Applicant: International Business Machines Corporation, Armonk, NY (US)

(72) Inventors: Charles L. Arvin, Poughkeepsie, NY (US); Bhupender Singh, Fishkill, NY (US); Richard Francis Indyk, Saratoga Springs, NY (US); Steve Ostrander, Poughkeepsie, NY (US); Thomas Weiss, Poughkeepsie, NY (US); Mark Kapfhammer, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 53 days.

This patent is subject to a terminal disclaimer.

(21) Appl. No.: 17/178,375

(22) Filed: Feb. 18, 2021

(65) Prior Publication Data

US 2021/0175207 A1 Jun. 10, 2021

Related U.S. Application Data

(63) Continuation of application No. 16/369,532, filed on Mar. 29, 2019, now Pat. No. 11,031,373.

(51) Int. Cl.
*H01L 25/065* (2006.01)
*H01L 23/00* (2006.01)
(Continued)

(52) U.S. Cl.
CPC ...... *H01L 25/0655* (2013.01); *H01L 23/5223* (2013.01); *H01L 23/53228* (2013.01); *H01L 24/09* (2013.01); *H01L 2924/1431* (2013.01)

(58) Field of Classification Search
CPC .................................................. H01L 25/0655
(Continued)

(56) References Cited

U.S. PATENT DOCUMENTS

| 5,182,632 A | 1/1993 | Bechtel et al. |
| 5,648,890 A | 7/1997 | Loo et al. |

(Continued)

FOREIGN PATENT DOCUMENTS

| CN | 202423279 U | 9/2012 |
| CN | 205621722 U | 10/2016 |

OTHER PUBLICATIONS

International Search Report and Written Opinion for PCT Application No. PCT/IB2020/052464, dated Jul. 24, 2020, pp. 1-9.

(Continued)

*Primary Examiner* — Quoc D Hoang
(74) *Attorney, Agent, or Firm* — Cantor Colburn LLP; L. Jeffrey Kelly (57) ABSTRACT

A multi-die integrated circuit device and a method of fabricating the multi-die integrated circuit device involve a substrate. Two or more dice include components that implement functionality of the multi-die integrated circuit. The components include logic gates. The multi-die integrated circuit device also includes a spacer disposed between the substrate and each of the two or more dice. Each of the two or more dice makes direct electrical contact with the substrate without making direct electrical contact with the spacer through holes in the spacer.

20 Claims, 7 Drawing Sheets

(51) Int. Cl.
  *H01L 23/522* (2006.01)
  *H01L 23/532* (2006.01)

(58) Field of Classification Search
  USPC .................................................. 257/690, 698
  See application file for complete search history.

(56) References Cited

U.S. PATENT DOCUMENTS

| | | |
|---|---|---|
| 7,787,254 B2 | 8/2010 | Clayton et al. |
| 8,519,543 B1 | 8/2013 | Song et al. |
| 9,418,962 B2 | 8/2016 | Pagaila |
| 9,553,041 B1 | 1/2017 | Kelly et al. |
| 11,031,373 B2 * | 6/2021 | Arvin ..................... H01L 24/73 |
| 2007/0170582 A1 * | 7/2007 | Nomura ................. H05K 1/181 |
| | | 257/723 |
| 2014/0151895 A1 * | 6/2014 | West ..................... H01L 23/481 |
| | | 257/774 |
| 2014/0312483 A1 | 10/2014 | Vo et al. |
| 2015/0111318 A1 | 4/2015 | Lyne et al. |
| 2018/0013052 A1 | 1/2018 | Oliver et al. |
| 2018/0358298 A1 | 12/2018 | Zhai et al. |
| 2019/0287908 A1 | 9/2019 | Dogiamis et al. |
| 2020/0312812 A1 | 10/2020 | Arvin et al. |

OTHER PUBLICATIONS

List of IBM Patents or Patent Applications Treated as Related; (Appendix P), Filed Feb. 18, 2021; 2 pages.

* cited by examiner

FIG. 7

SPACER FOR DIE-TO-DIE COMMUNICATION IN AN INTEGRATED CIRCUIT AND METHOD FOR FABRICATING THE SAME

DOMESTIC PRIORITY

This application is a continuation of U.S. application Ser. No. 16/369,532 filed Mar. 29, 2019, the disclosure of which is incorporated herein by reference in its entirety.

BACKGROUND

The present invention relates to integrated circuits, and more specifically, to a spacer for die-to-die communication in an integrated circuit.

Typically, integrated circuits are produced on a single wafer through photolithographic processes. The wafer is cut (i.e., diced) into many pieces, each of which is referred to as a die. Each die is generally a copy of the circuit. As the die continues to become more complex and increase in size, die yield is decreasing. This is because, for a given defect density, the increased density of the die results in a higher chance of random defects. An approach to reducing yield loss involves splitting the die to reduce the density and, consequently, the defects. However, splitting the components of a single die to two or more dice requires greater communication among the dice at sufficiently high rates. Silicon (Si) bridges have been used to interconnect dice but have led to significant challenges in assembly. Si interposers to interconnect dice require through-Si-via (TSV) processes and have also resulted in assembly challenges. Additionally, Si interposers can also present power delivery and signal integrity issues.

SUMMARY

Embodiments of the present invention are directed to a multi-die integrated circuit device and a method of fabricating a multi-die integrated circuit device involve a substrate, and two or more dice that include components that implement functionality of the multi-die integrated circuit. The components include logic gates. The multi-die integrated circuit device also includes a spacer disposed between the substrate and each of the two or more dice. Each of the two or more dice makes direct electrical contact with the substrate without making direct electrical contact with the spacer through holes in the spacer.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

As previously noted, distributing the components of an integrated circuit from one die to two or more can reduce the defects on each die and, thus, reduce the yield loss. The distribution of integrated circuit functionality onto two or more dice requires die-to-die communication at sufficiently high rates. Si bridges are a prior approach to die-to-die communication. The Si bridges wire one die to another directly and on the same side that the die is joined. The bridge makes no electrical connection to the substrate. An interposer is another prior approach and facilitates interconnection among multiple dice. Electrical pass-throughs (e.g., TSV) are part of the interposer and make electrical connections through the interposer, and the interposer makes electrical connection with the substrate. As previously noted, the Si bridge and interposer present assembly challenges. Embodiments of the invention detailed herein relate to a spacer for die-to-die communication in an integrated circuit. Unlike the interposer, the spacer that is fabricated according to one or more embodiments of the invention detailed herein does not require electrical pass-throughs. Each die has conductive posts that pass through holes of the spacer to directly contact the substrate on the other side of the spacer from the die.

Figure 1:
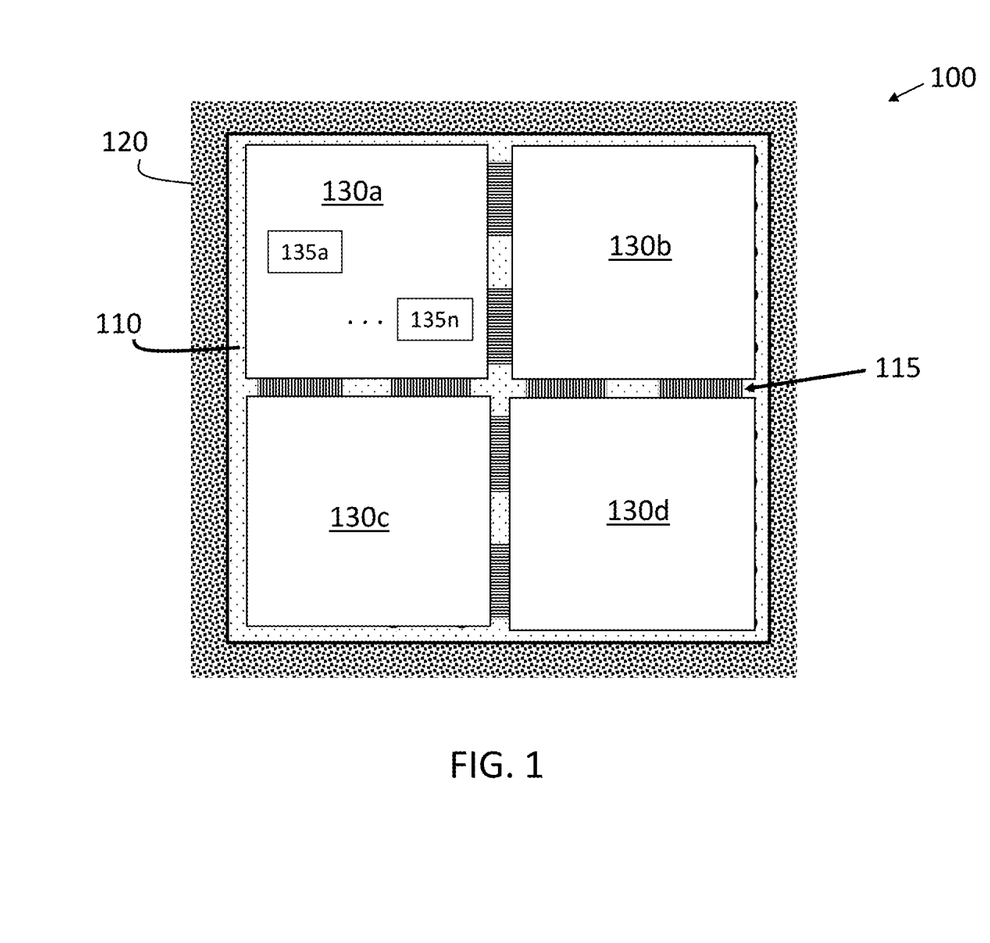
FIG. 1 shows a spacer for die-to-die communication according to an exemplary embodiment of the invention.
Figure 3:
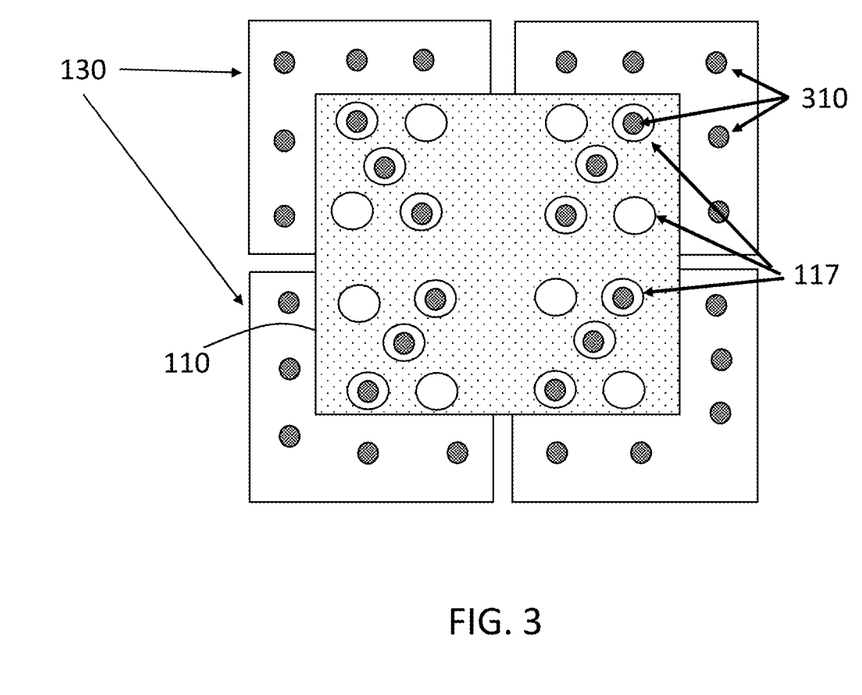
FIG. 3 details aspects of the spacer that facilitate die-to-die communication according to one or more embodiments of the invention.

FIG. 1 shows a spacer 110 for die-to-die communication according to an exemplary embodiment of the invention. According to the exemplary embodiment shown in FIG. 1, the integrated circuit 100 is sub-divided into four dice 130a, 130b, 130c, 130d (generally referred to as 130). In alternate embodiments of the invention, the integrated circuit 100 can be subdivided into two or more dice 130 and is not limited to four. According to the exemplary embodiment shown in FIG. 1, the perimeter of the spacer 110 is larger than the perimeter enclosing the combination of the dice 130. In alternate embodiments, the perimeter of the spacer 110 can be smaller than the perimeter enclosing the combination of the dice 130, as shown in FIG. 3, or the perimeter of the spacer 110 and the perimeter enclosing the dice 130 can be the same size. Each die 130 includes a number of components 135a through 135n (generally referred to as 135). The components 135 (e.g., logic gates, buffers, latches) within each die 130 are interconnected in conventional ways to implement the functionality of the integrated circuit 100. In addition, based on the spacer 110 designed and fabricated according to one or more embodiments detailed herein, the components 135 of each die 130 can communicate with components 135 of another die 130 of the multi-die integrated circuit 100 based on the wiring 115 of the spacer 110. The dice 130 are joined on the same side (i.e., below each die 130 according to the view in FIG. 1) that they are interconnected by the wiring 115.

According to the example shown in FIG. 1, the wiring 115 facilitates communication between die 130a and dice 130b and 130c but not between die 130a and die 130d, for example. If needed diagonal wiring 115 can be included in the spacer 110 to facilitate communication between die 130a and die 130d or between die 130b and die 130c, for example. The exemplary wiring 115 shown in FIG. 1 is intended to be explanatory rather than exclusive and does not limit additional die-to-die communication according to alternate arrangements for the wiring 115. The wiring 115 can facilitate communication speeds in the range of 50 to 500 gigahertz (GHz). The spacer 110 that includes the wiring 115 that facilitates die-to-die communication is disposed between the dice 130 and a substrate 120 (e.g., organic laminate). Features of the spacer 110 are further detailed with reference to FIG. 2.

Figure 2:
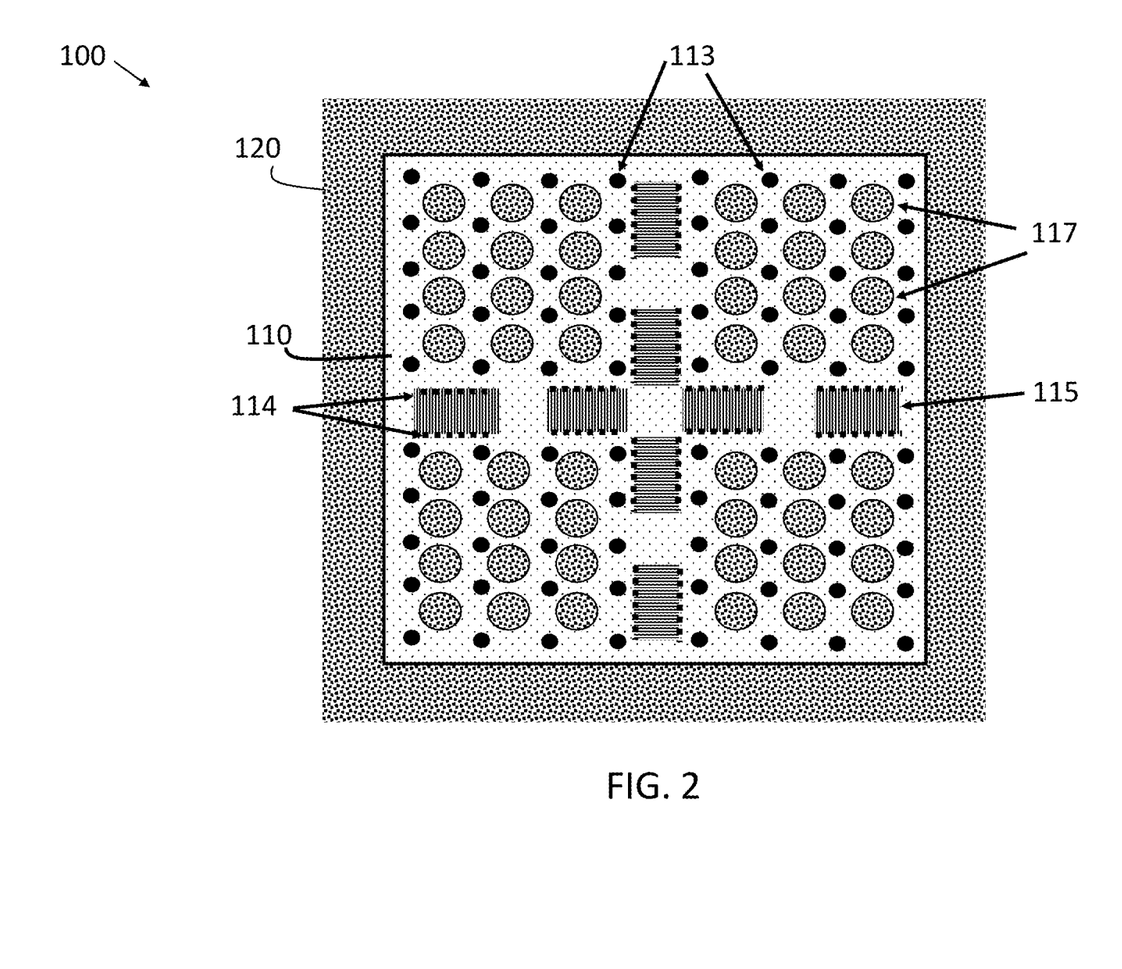
FIG. 2 shows details of the spacer that facilitates die-to-die communication according to an exemplary embodiment of the invention.

FIG. 2 shows details of the spacer 110 that facilitates die-to-die communication according to an exemplary embodiment of the invention. The material from which the spacer 110 is fabricated can be glass, Si, ceramic, or an organic low-coefficient of thermal expansion (CTE) material. The wiring 115 that facilitates die-to-die communication is shown. There can be many layers (e.g., on the order of 4-10 layers) of wires, with a pitch (i.e., a distance between wires) on the order of 15-20 microns, formed using a dual damascene process.

Figure 4:
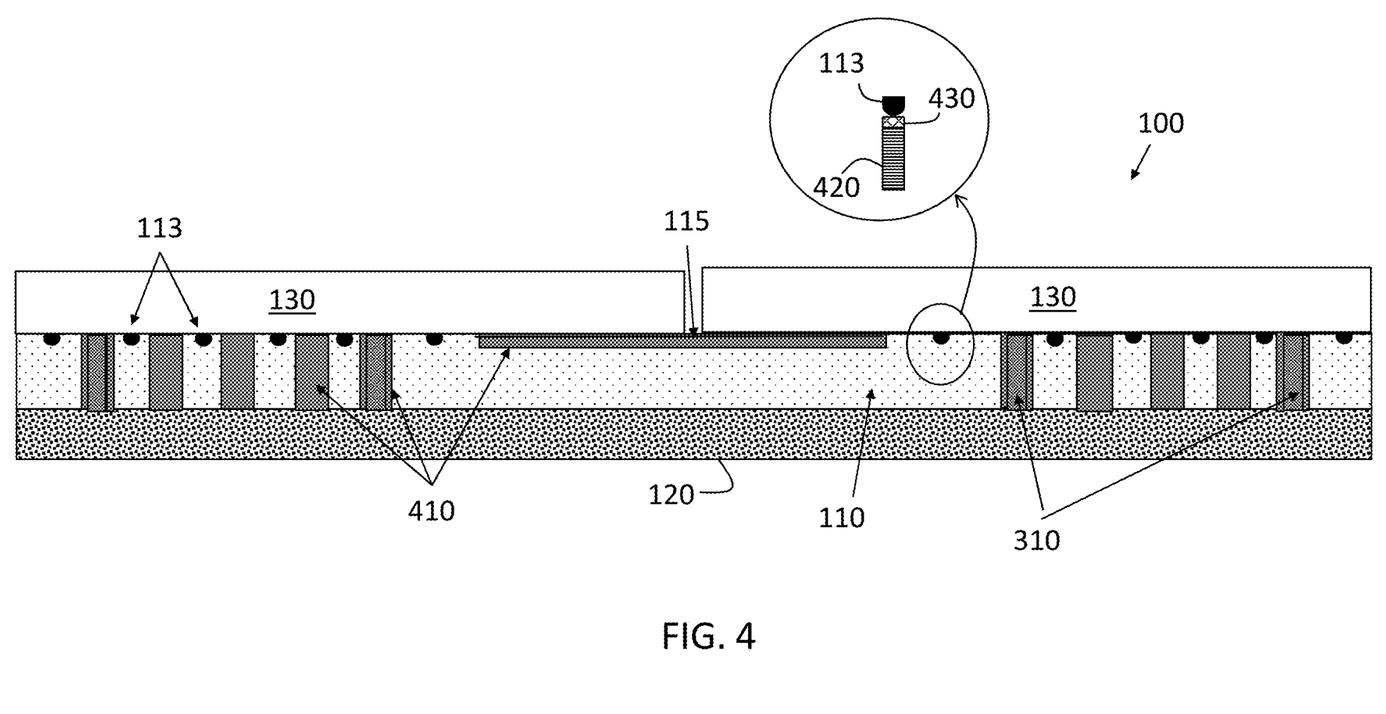
FIG. 4 shows a cross-sectional view of an integrated circuit with a spacer for die-to-die communication according to one or more embodiments of the invention.

Pads 113 act to mechanically connect the spacer 110 to the dice 130. The pads 113 are shown on the spacer 110 in FIG. 2, according to an exemplary embodiment of the invention. Specifically, the pads 113 can be copper (Cu) micro-pads within a passivation oxide layer 520 (FIG. 5) of the spacer 110. According to another exemplary embodiment of the invention, the pads 113 can be on the dice 130 and micropillars 420 with a solder cap 430 can be on the spacer 110, as shown in FIG. 4. In exemplary embodiments, a Si spacer 110 can include a capacitor 510 (FIG. 5) formed as a layer within the spacer 110. An organic, glass, or ceramic spacer 110 can include thin film capacitors. In that case, the pads 113 also act as electrical connections between the dice 130 and the capacitors. Pads 114 at the ends of the wiring 115 form electrical connections between the dice 130 that are interconnected by the wiring 115. For example, there can be on the order of 3500-5000 pads 114 to facilitate die-to-die communication. The pads 113, 114 can be shaped differently than shown in FIG. 2. Spar, a stiffening element, can be added to the same side of the spacer 110 as the substrate 120. The spacer 110 also includes holes 117 that are further discussed with reference to FIG. 3.

FIG. 3 shows a spacer 110 for die-to-die communication according to an embodiment of the invention. According to the exemplary embodiment shown in FIG. 3, the perimeter of the spacer 110 is smaller than the perimeter enclosing the combination of the dice 130. Unlike FIG. 1, which shows a view of an exemplary spacer 110 with the substrate 120 below and the die 130 above, FIG. 3 shows the die 130 below the spacer 110 for explanatory purposes. Thus, the high-density wiring 115 of the spacer 110 that interconnects the dice 130 is not visible in the view shown in FIG. 3. In addition, the substrate 120, which would be above the spacer 110 according to the view in FIG. 3, is not shown. Posts 310 are shown on the dice 130. Some of the holes 117 in the spacer 110 facilitate pass-through of these conductive posts 310 of the dice 130 which would directly contact the substrate 120 on the opposite side of the spacer 110. Because the perimeter of the spacer 110 is less than the perimeter enclosing the dice 130 according to the embodiment shown in FIG. 3, the dice 130 have conductive posts 310 outside the perimeter of the spacer 110, as well. These conductive posts 310 would contact the substrate 120 without passing through a hole 117 in the spacer 110.

While the holes 117 are shown as circular according to the exemplary embodiment, the holes 117 can be any shape that facilitates pass-through of the conductive posts 310 without contacting the spacer 110. That is, for example, the diameter of the circular holes 117 can be on the order of 20 microns larger than the diameter of the conductive posts 310 that pass through the holes 117. The holes 117 are on the order of 100 microns in diameter. If the material of the spacer 110 is Si, the holes 117 can be passivated to prevent shorting with the conductive posts 310. The holes 117 are formed to align with the conductive posts 310 such that the conductive posts 310 are essentially centered on the holes 117. There are more holes 117 than conductive posts 310 between the dice 130 and spacer 110 (although there can be additional posts 310 outside the perimeter of the spacer 110 as in the embodiment shown in FIG. 3). As discussed with reference to FIG. 4, the holes 117 that do not act as pass-throughs for conductive posts 310 and the portions of the holes 117 outside the conductive posts 310 can have underfill 410 (FIG. 4) dispensed in them.

FIG. 4 shows a cross-sectional view of an integrated circuit 100 with a spacer 110 for die-to-die communication according to one or more embodiments of the invention. The cross-section view shows two dice 130 interconnected with wiring 115 of the spacer 110. The perimeter of the exemplary spacer 110 shown in FIG. 4 is the same as the perimeter enclosing the dice 130. Conductive posts 310 that are part of the dice 130 are shown extending to connect each die 130 to the substrate 120. The conductive posts 310 can be Cu, for example. As previously noted, the conductive posts 310 do not fill the holes 117 (FIGS. 2 and 3) in the spacer 110. Instead, the conductive posts 310 have a smaller diameter than the diameter of the hole 117 such that the conductive posts 310 pass through but do not contact the spacer 110. For example, the diameter of the conductive posts 310 can be on the order of 80 microns while, as previously noted, the diameter of the holes 117 can be on the order of 100 microns. The height of the conductive posts 310, which must be at least the same as the thickness of the spacer 110 to reach the substrate 120, can be on the order of 150-200 microns. As also noted, all the holes are not used to pass conductive posts 310. Other holes 117 facilitate underfill 410 dispense from either side of the spacer 110.

The pads 113 between the spacer 110 and the dice 130 are indicated. The pads 114 between the wiring 115 and the dice 130, as well as aspects of the wiring 115, are not visible in FIG. 4 due to the underfill 420. As previously noted, there are more holes 117 than there are conductive posts 310. Underfill 410 can be dispensed in the open area around the conductive posts 310 in the spacer holes 117, as shown. Underfill 410 is a polymeric substance that is dispensed on the substrate 120. Capillary action draws the underfill 410 between each die 130 and the substrate 120 (into the holes 117 of the spacer 110). Thermal curing results in the mechanical coupling of the die 130 and the substrate 120. The underfill 410 encapsulates interconnect structures like the wiring 115 and uniformly distributes stress over the entire die 130 rather than concentrating stress at solder joints. Thus, the underfill 410 acts as a stress buffer that absorbs the CTE mismatch between each die 130 and the substrate 120 and protects solder joints and interconnections from premature failure. According to the exemplary embodiment shown in FIG. 4, the pads 113 are on the dice 130. As the detailed view of one connection between a die 130 and the spacer 110 shows, a micro-pillar 420 of the spacer 110 with a solder cap 430 can connect with the pad 113 of the dice 130. The micro-pillar 420 can be on the order of 10 microns deep.

Figure 5:
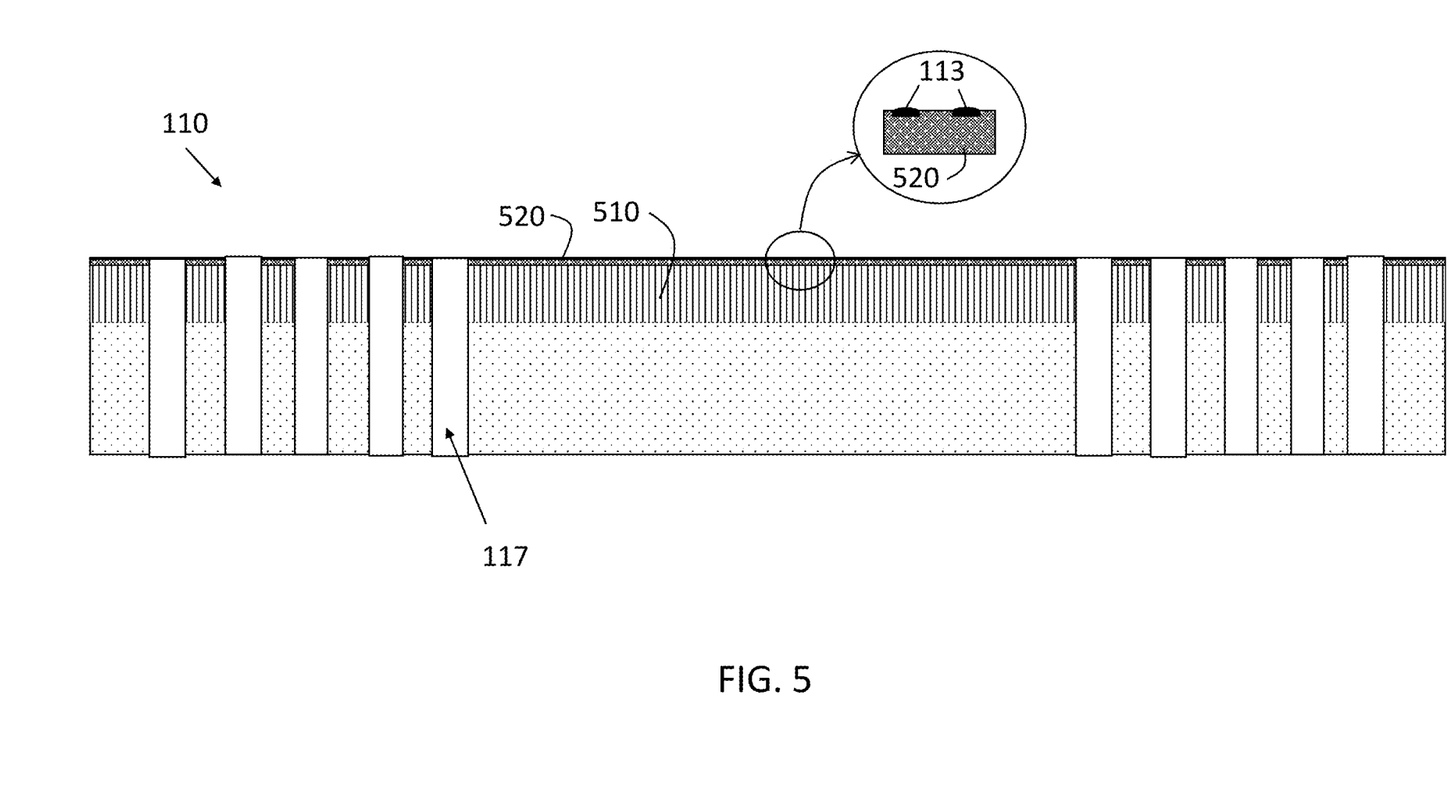
FIG. 5 shows a cross-sectional view of a spacer for die-to-die communication including a capacitor according to one or more embodiments of the invention.

FIG. 5 shows a cross-sectional view of a spacer 110 for die-to-die communication including a capacitor 510 according to one or more embodiments of the invention. A passivation oxide 520 is shown above the capacitor 510. The expanded view shows pads 113 within the oxide 520. A deep trench (DT) formation or metal-insulator-metal (MIM) configuration can be used to form the capacitor 510. The capacitor can occupy up to 95 percent of the cross-sectional area of the spacer 110 according to the MIM configuration. A DT capacitor 510 can be on the order of 20 to 100 microns wide while a MIM capacitor 510 can be on the order of 0.5 to 10 microns wide. As FIG. 5 indicates, the capacitor 510 is formed around the holes 117 of the spacer 110.

Figure 6:
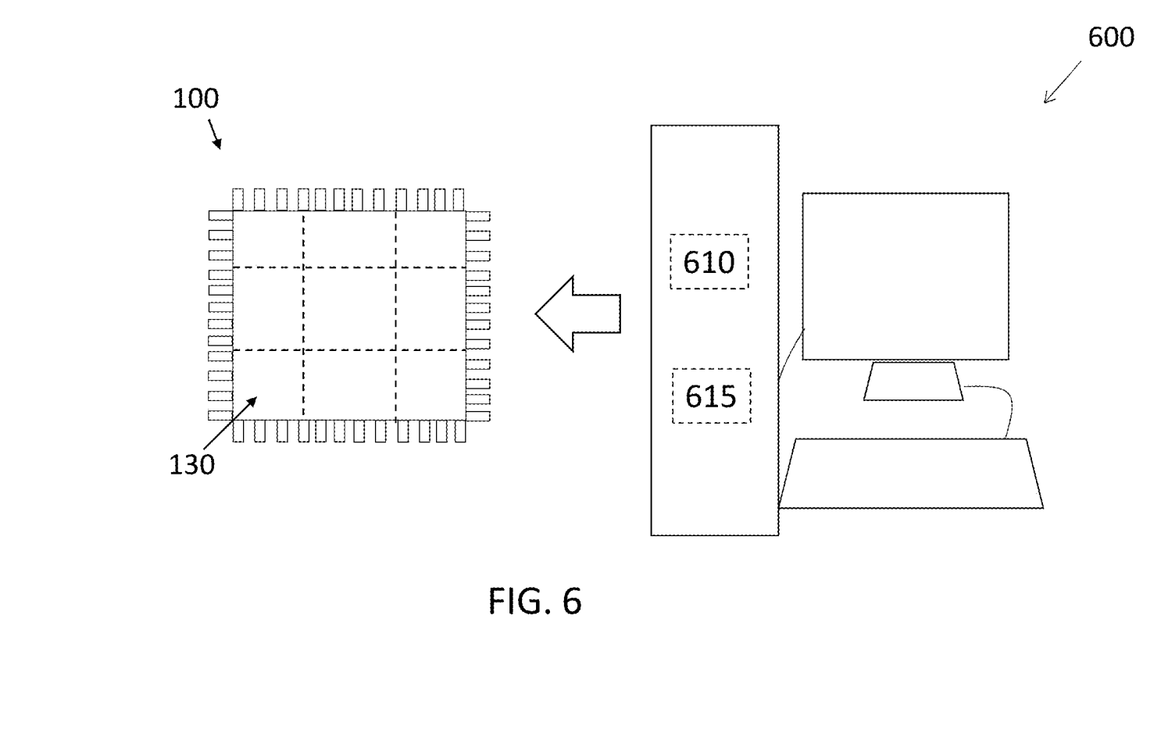
FIG. 6 is a block diagram of a system to perform integrated circuit development that includes implementing die-to-die communication with a spacer according to one or more embodiments of the invention.

FIG. 6 is a block diagram of a system 600 to perform integrated circuit development that includes implementing die-to-die communication with a spacer 110 according to one or more embodiments of the invention. The system 600 includes processing circuitry 610 and memory 615 that is used to generate the design that is ultimately fabricated into the multi-die integrated circuit 100. The phases (e.g., logic design, logic synthesis, physical synthesis) involved in developing the design to meet functional, power, and timing requirements are not new and not detailed here. It does bear noting that the physical synthesis and layout phases can take into account that the integrated circuit 100 will ultimately be split into multiple dice 130. The finalized physical layout is provided to a semiconductor manufacturer (e.g., a foundry). Masks are generated for each layer of each die 130 of the integrated circuit 100 based on the finalized physical layout. Then, the wafer is processed in the sequence of the mask order. The processing includes photolithography and etch. The fabrication is further discussed with reference to FIG. 7.

Figure 7:
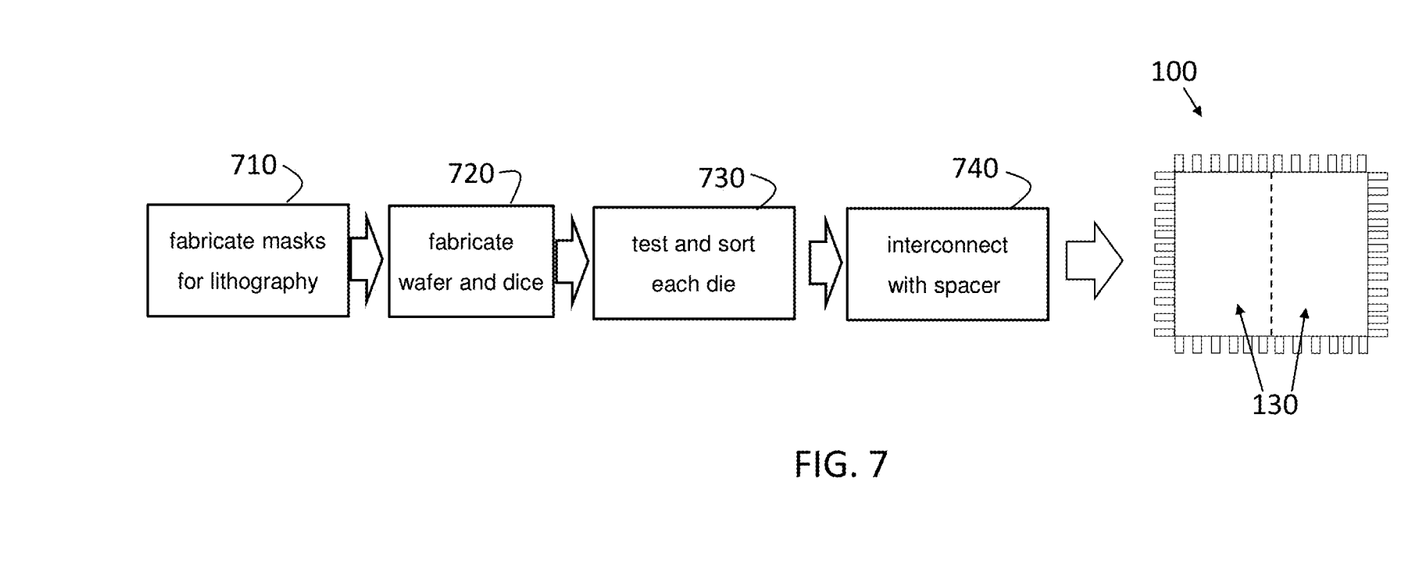
FIG. 7 is a process flow of a method of fabricating the multi-die integrated circuit that includes a spacer according to one or more embodiments of the invention.

FIG. 7 is a process flow of a method of fabricating the multi-die integrated circuit 100 that includes a spacer 110 according to one or more embodiments of the invention. Generally, a wafer with multiple copies of the final design is fabricated and cut (i.e., diced) such that each die is one copy of the integrated circuit 100. In the case of the multi-die configuration, each die is further sub-divided into the die 130 that communicate with each other via the spacer 110. At block 710, the processes include fabricating masks for lithography based on the finalized physical layout. At block 720, fabricating the wafer includes using the masks to perform photolithography and etching. Once the wafer is diced into the dice 130, testing and sorting each die is performed, at block 730, to filter out any faulty die. As previously noted, one of the reasons for subdividing the device into the multiple dice 130 is to reduce the faults. At block 740, the spacer 110 according to one or more embodiments of the invention, is coupled between the dice 130 and the substrate as previously discussed to result in the integrated circuit 100 with die-to-die communication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A multi-die integrated circuit device, comprising:
   a substrate;
   two or more dice comprising components that implement functionality of the multi-die integrated circuit, wherein the components include logic gates;
   a spacer disposed between the substrate and each of the two or more dice, wherein each of the two or more dice makes direct electrical contact with the substrate through holes in the spacer, the holes also include a polymeric substance, and each of the two or more dice does not make direct electrical contact with the spacer.

2. The device according to claim 1, wherein the spacer includes wiring to connect one of the two or more dice to another of the two or more dice.

3. The device according to claim 2, wherein the wiring includes pads to electrically connect each end of the wiring to the one or the another of the two or more dice.

4. The device according to claim 2, wherein the wiring is encapsulated by the polymeric substance.

5. The device according to claim 1, wherein the spacer includes mechanical pads to mechanically connect the spacer to one of the two or more dice.

6. The device according to claim 1, wherein each of the two or more dice makes electrical contact with the substrate via conductive posts that respectively pass through the holes in the spacer.

7. The device according to claim 6, wherein the conductive posts are copper.

8. The device according to claim 1, wherein the spacer includes a capacitor, and the spacer includes an oxide above the capacitor.

9. The device according to claim 1, wherein the spacer is silicon, glass, ceramic, or an organic low-coefficient of thermal expansion (CTE) material.

10. The device according to claim 1, wherein the holes in the spacer are passivated.

11. A method of fabricating a multi-die integrated circuit, the method comprising:
fabricating two or more dice comprising components that implement functionality of the multi-die integrated circuit, wherein the components include logic gates;
fabricating a spacer and disposing the spacer between a substrate and each of the two or more dice such that each of the two or more dice makes direct electrical contact with the substrate through holes in the spacer, wherein the holes also include a polymeric substance and each of the two or more dice does not make direct electrical contact with the spacer.

12. The method according to claim 11, wherein the fabricating the spacer includes disposing wiring on a same side of the spacer as the two or more dice to connect one of the two or more dice to another of the two or more dice.

13. The method according to claim 12, further comprising disposing electrical pads to electrically connect each end of the wiring to the one or the another of the two or more dice.

14. The method according to claim 12, further comprising encapsulating the wiring in the polymeric substance.

15. The method according to claim 11, wherein the fabricating the spacer includes disposing mechanical pads on a same side of the spacer as the two or more dice to mechanically connect the spacer to one of the two or more dice.

16. The method according to claim 11, wherein the fabricating the spacer includes positioning the holes such that each of the two or more dice makes electrical contact with the substrate via conductive posts that respectively pass through the holes in the spacer.

17. The method according to claim 16, wherein the fabricating the spacer includes sizing the holes to be larger than a diameter of the conductive posts.

18. The method according to claim 11, wherein the fabricating the spacer includes forming a capacitor using a deep trench formation or a metal-insulator-metal configuration or as a thin film, and the forming the capacitor includes forming an oxide layer on the capacitor.

19. The method according to claim 11, wherein the fabricating the spacer includes using silicon, glass, ceramic, or an organic low-coefficient of thermal expansion (CTE) material as a material of the spacer.

20. The method according to claim 11, wherein the fabricating the spacer includes passivating the holes of the spacer.

* * * * *